(12) United States Patent
Matsumoto et al.

(10) Patent No.: US 8,600,070 B2
(45) Date of Patent: Dec. 3, 2013

(54) SIGNAL PROCESSING APPARATUS AND IMAGING APPARATUS

(75) Inventors: Tsuyoshi Matsumoto, Tokyo (JP); Mitsuhiro Okazaki, Saitama (JP)

(73) Assignee: Nikon Corporation, Tokyo (JP)

( * ) Notice: Subject to any disclaimer, the term of this patent is extended or adjusted under 35 U.S.C. 154(b) by 334 days.

(21) Appl. No.: 12/913,903

(22) Filed: Oct. 28, 2010

(65) Prior Publication Data

US 2011/0205385 A1 Aug. 25, 2011

(30) Foreign Application Priority Data

Oct. 29, 2009 (JP) ................................. 2009-248953
Oct. 29, 2009 (JP) ................................. 2009-248954

(51) Int. Cl.
*A61F 11/06* (2006.01)
*G10K 11/16* (2006.01)
*H03B 29/00* (2006.01)

(52) U.S. Cl.
USPC ..................................................... 381/71.14

(58) Field of Classification Search
USPC ..................................................... 381/71.14
See application file for complete search history.

(56) References Cited

U.S. PATENT DOCUMENTS

| 6,480,610 B1 * | 11/2002 | Fang et al. ................ 381/321 |
| 2006/0025992 A1 * | 2/2006 | Oh ................................ 704/226 |
| 2009/0154717 A1 | 6/2009 | Hoshuyama |

FOREIGN PATENT DOCUMENTS

| JP | A-2005-037650 | 2/2005 |
| JP | A-2005-195955 | 7/2005 |
| JP | A-2006-270591 | 10/2006 |
| JP | A-2006-279185 | 10/2006 |
| JP | A-2008-058343 | 3/2008 |
| JP | A-2008-304635 | 12/2008 |
| WO | WO 2007/049644 A1 | 5/2007 |

OTHER PUBLICATIONS

Nov. 22, 2011 Office Action issued in Japanese Patent Application No. 2009-248954 (with partial translation).
Dec. 6, 2011 Office Action issued in Japanese Patent Application No. 2009-248953 (with partial translation).

* cited by examiner

*Primary Examiner* — Alexander Jamal
(74) *Attorney, Agent, or Firm* — Oliff & Berridge, PLC

(57) ABSTRACT

A signal processing apparatus includes a signal transforming unit transforming a first sound signal obtained by dividing a sound signal represented by a time function and by the predetermined time width into a second sound signal represented by a frequency function; a calculating unit determining a third sound signal which has a reduced influence of the operation sound by using the second sound signal and a sound signal representing the operation sound; a correcting unit performing a correction, by setting a sound signal representing the target sound as a reference signal, on the third sound signal based on the reference signal; and a signal inverse transforming unit inverse-transforming a sound signal on which the correction is performed from the sound signal represented by the frequency function into the sound signal represented by the time function.

20 Claims, 6 Drawing Sheets

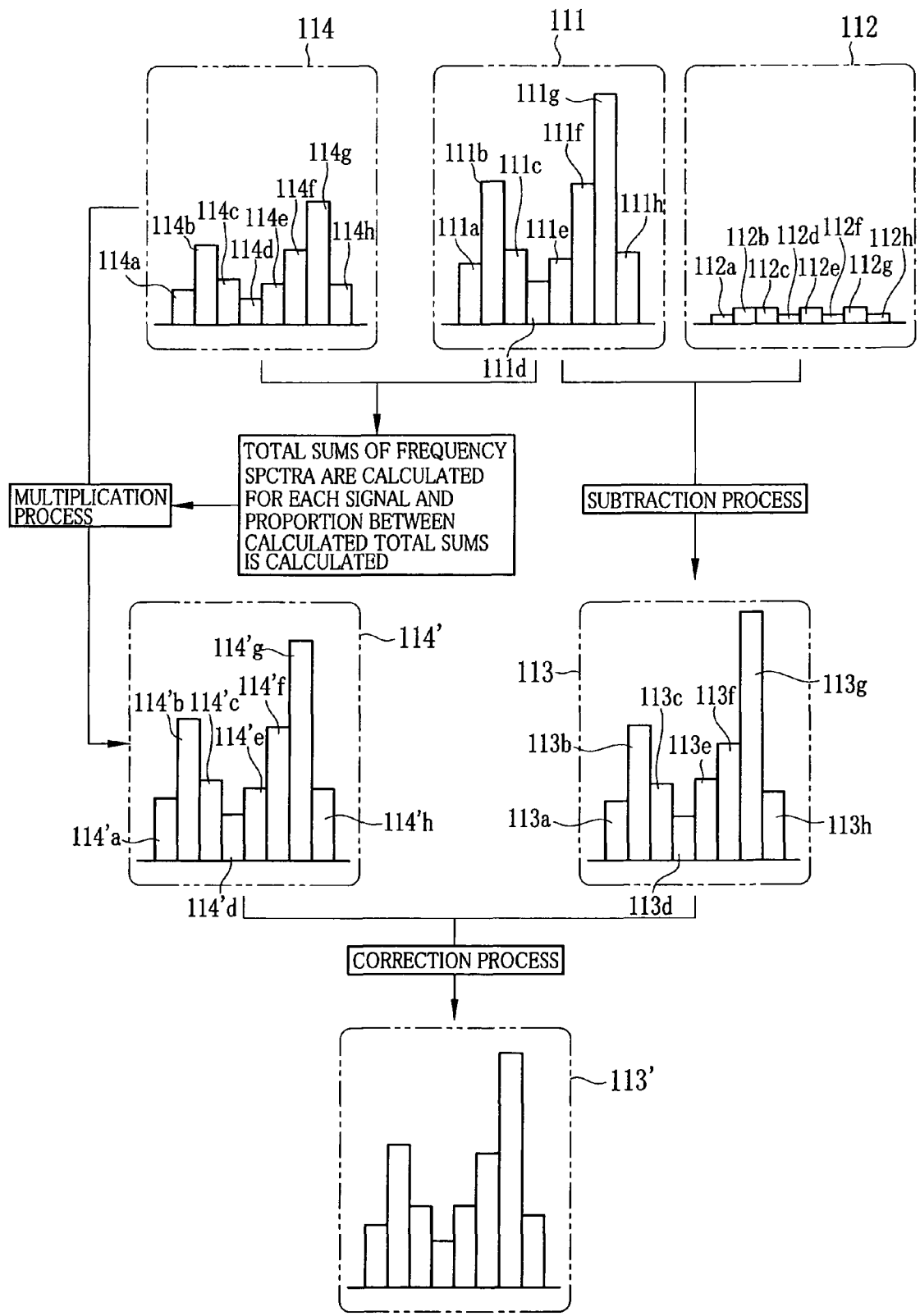

SIGNAL PROCESSING APPARATUS AND IMAGING APPARATUS

CROSS-REFERENCE TO RELATED APPLICATIONS

This application is based upon and claims the benefit of priority from Japanese Patent Application Nos. 2009-248953 and 2009-248954, both filed on Oct. 29, 2009, the entire contents of which are incorporated herein by reference.

BACKGROUND

1. Field

The present application relates to a signal processing apparatus and an imaging apparatus which reduce a noise signal included in a sound signal.

2. Description of the Related Art

As a method of reducing a component based on a noise sound (noise component) from a sound signal in which a sound of target and a noise sound are mixed, it is generally performed to estimate the noise sound from the obtained sound signal and to subtract a signal of the estimated noise sound (referred to hereinafter as noise signal) from the sound signal (Japanese Unexamined Patent Application Publication No. 2005-195955).

With the use of such a method, when the noise sound is previously obtained or the noise sound is formed of a periodical sound, an intensity of the noise sound and a timing at which the noise sound is included can be easily estimated, so that the noise signal can be appropriately reduced from the sound signal. However, if a sound generated when driven various mechanisms and the like inside an apparatus (referred to hereinafter as operation sound) is recognized as the noise sound, since a timing at which the aforementioned operation sound is generated is aperiodic, it is difficult to estimate the noise sound included in the sound signal. For this reason, a noise component called musical noise may be included in a sound signal after the noise signal is subtracted therefrom.

SUMMARY

A proposition of the present application is to provide a signal processing apparatus and an imaging apparatus designed to be able to appropriately reduce an operation sound included in a sound signal.

In order to solve the aforementioned problems, a signal processing apparatus of the present application is characterized in that it includes a signal transforming unit that transforms a first sound signal for each predetermined time width obtained by dividing a sound signal represented by a time function and in which a target sound and an operation sound are mixed, by a predetermined time width, into a second sound signal represented by a frequency function; a calculating unit that determines a third sound signal which has a reduced influence of the operation sound by using the second sound signal and a sound signal representing the operation sound; a correcting unit that performs a correction, by setting a sound signal representing the target sound among the second sound signal as a reference signal, on a frequency characteristic of the third sound signal based on a frequency characteristic of the reference signal; and a signal inverse transforming unit that inverse-transforms a sound signal on which the correction is performed by the correcting unit from the sound signal represented by the frequency function into the sound signal represented by the time function.

Further, the frequency characteristic is a frequency spectrum, and the correcting unit preferably performs a correction on the third sound signal based on a result obtained by comparing a value of a frequency spectrum in each frequency range of the third sound signal with a value of a frequency spectrum in a corresponding frequency range of the reference signal multiplied by a coefficient.

Further, the correcting unit preferably replaces the value of the frequency spectrum of the third sound signal with the value of a corresponding frequency spectrum of the reference signal multiplied by the coefficient when the value of the frequency spectrum of the third sound signal is different from the value of the corresponding frequency spectrum.

Further, the correcting unit preferably performs a correction on the value of the frequency spectrum of the third sound signal to prevent the value from being lower than the value of a corresponding frequency spectrum of the reference signal multiplied by the coefficient when the value of the frequency spectrum of the third sound signal is less than the value of the corresponding frequency spectrum.

Further, the correcting unit preferably performs a correction on the value of the frequency spectrum of the third sound signal to prevent the value from exceeding the value of a corresponding frequency spectrum of the reference signal multiplied by the coefficient when the value of the frequency spectrum of the third sound signal exceeds the value of the corresponding frequency spectrum.

Further, the correcting unit preferably replaces the value of the frequency spectrum of the third sound signal with a correction value being calculated by using the value of a corresponding frequency spectrum of the reference signal multiplied by the coefficient and values of frequency spectra in frequency ranges a the vicinity thereof among frequency spectra of the reference signal multiplied by the coefficient when the value of the frequency spectrum of the third sound signal is different from the value of the corresponding frequency spectrum.

In this case, the correction value is preferably any one of an average of the value of the corresponding frequency spectrum and the values of the frequency spectra in the frequency ranges in the vicinity thereof, a maximum value among the value of the corresponding frequency spectrum and the values of the frequency spectra in the frequency ranges in the vicinity thereof, and a minimum value among the value of the corresponding frequency spectrum and the values of the frequency spectra in the frequency ranges in the vicinity thereof.

Further, the correcting unit preferably performs a correction on the value of the frequency spectrum of the third sound signal to prevent the value from exceeding a correction value being calculated by using the value of a corresponding frequency spectrum of the reference signal multiplied by the coefficient and values of frequency spectra in frequency ranges in a vicinity thereof among frequency spectra of the reference signal multiplied by the coefficient when the value of the frequency spectrum of the third sound signal exceeds the value of the corresponding frequency spectrum.

In this case, the correction value is preferably any one of an average of the value of the corresponding frequency spectrum and the values of the frequency spectra in the frequency ranges in the vicinity thereof, a maximum value among the value of the corresponding frequency spectrum and the values of the frequency spectra in the frequency ranges in the vicinity thereof, and a minimum value among the value of the corresponding frequency spectrum and the values of the frequency spectra in the frequency ranges in the vicinity thereof.

Further, the correcting unit preferably performs a correction on the value of the frequency spectrum of the third sound signal to prevent the value from being lower than a correction value calculated by using the value of a corresponding frequency spectrum of the reference signal multiplied by the coefficient and values of frequency spectra in frequency ranges in a vicinity thereof among frequency spectra of the reference signal multiplied by the coefficient when the value of the frequency spectrum of the third sound signal is less than the value of the corresponding frequency spectrum.

In this case, the correction value is preferably any one of an average of the value of the corresponding frequency spectrum and the values of the frequency spectra in the frequency ranges in the vicinity thereof, a maximum value among the value of the corresponding frequency spectrum and the values of the frequency spectra in the frequency ranges in the vicinity thereof, and a minimum value among the value of the corresponding frequency spectrum and the values of the frequency spectra in the frequency ranges in the vicinity thereof.

Further, an imaging apparatus of the present application is characterized in that it includes an imaging unit that obtains an image signal; a sound pickup unit that obtains a sound signal in synchronization with an obtainment of the image signal by the imaging unit; the above-described signal processing apparatus; and a storage unit that stores the image signal obtained by the imaging unit and a sound signal on which signal processing is performed by the signal processing apparatus.

Further, a signal processing apparatus of the present application is characterized in that it includes a signal transforming unit that transforms a first sound signal for each predetermined time width obtained by dividing a sound signal represented by a time function and in which a target sound and an operation sound are mixed, by the predetermined time width, into a second sound signal represented by a frequency function; a signal calculating unit that determines a third sound signal which has a reduced influence of the operation sound by using the second sound signal and a sound signal representing the operation sound; a proportion calculating unit that determines, by setting a sound signal representing the target sound among the second sound signal as a reference signal, a proportion between an intensity of the reference signal and an intensity of the third sound signal; a correcting unit that corrects a frequency characteristic of the third sound signal based on a frequency characteristic of the reference signal multiplied by the proportion; and a signal inverse transforming unit that inverse-transforms a sound signal corrected by the correcting unit from the sound signal represented by the frequency function into the sound signal represented by the time function.

Further, the frequency characteristic is a frequency spectrum, and the correcting unit preferably performs a correction on the frequency characteristic of the third sound signal in each of the third sound signal and the reference signal multiplied by the proportion based on a ratio between a value based on a value of a frequency spectrum in at least one of frequency ranges and a value of a frequency spectrum in remaining frequency ranges.

Further, the ratio is preferably a ratio between a value of a frequency spectrum in a certain frequency range and either a total sum of a value of a frequency spectrum in all of the frequency ranges or an average value of the frequency spectrum in all of the frequency ranges.

Further, the ratio is preferably a ratio between the value of the frequency spectrum in the specific frequency range either a total sum of a value of a frequency spectrum in a specific frequency range among frequency ranges and values of frequency spectra in frequency ranges in a vicinity of the specific frequency range or an average value of the value of the frequency spectrum in the specific frequency range and the values of the frequency spectra in the frequency ranges in the vicinity of the specific frequency range.

Further, an imaging apparatus of the present application is characterized in that it includes an imaging unit that obtains an image signal, a sound pickup unit that obtains a sound signal in synchronization with an obtainment of the image signal by the imaging unit, the signal processing apparatus described above, and a storage unit that stores the image signal obtained by the imaging unit and a sound signal on which signal processing is performed by the signal processing apparatus.

BRIEF DESCRIPTION OF THE DRAWINGS

FIG. 8 is a view illustrating a flow of signal processing in the signal processing apparatus of the second embodiment.

DETAILED DESCRIPTION OF THE EMBODIMENT

Figure 1:
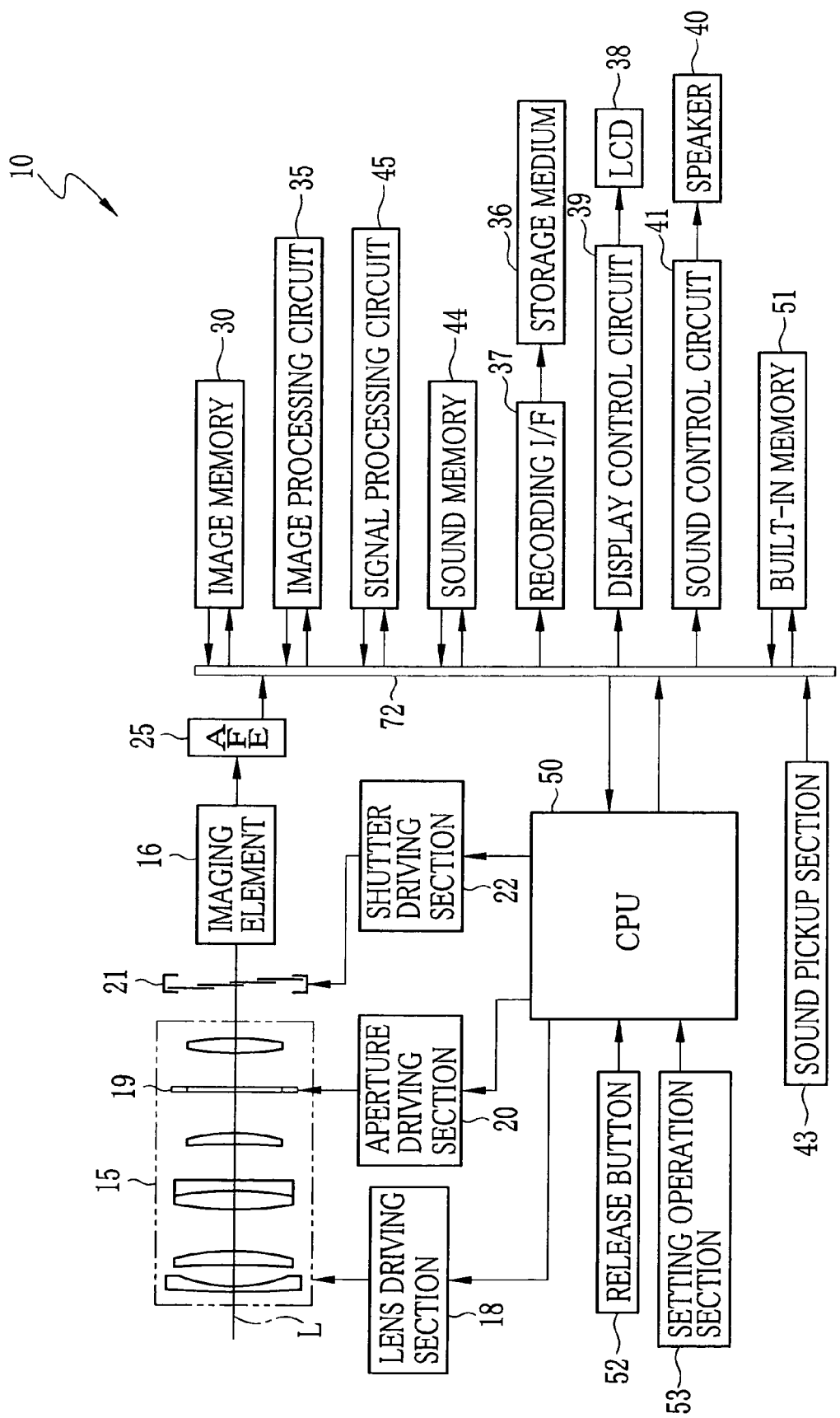
FIG. 1 is a functional block diagram illustrating a configuration of a digital camera.

Hereinafter, a configuration of a digital camera of the present application will be described. As illustrated in FIG. 1, a digital camera 10 performs photoelectric conversion, using an imaging element 16, on a subject light captured by an imaging optical system 15, and obtains image data from an electrical signal (image signal) after the photoelectric conversion is performed.

The imaging optical system 15 is formed of a plurality of lenses. Each lens that forms the imaging optical system 15 moves, at a time of changing a zoom magnification and adjusting a focus, along an optical axis L by being driven by a lens driving section 18. The imaging optical system 15 is provided with an aperture 19. The aperture 19 changes a light amount of the subject light incident toward the imaging element 16 by changing a size of an aperture opening. The size of the aperture opening of the aperture 19 is changed by an aperture driving section 20 so that a previously set aperture value is provided.

A shutter 21 is disposed between the imaging optical system 15 and the imaging element 16. The shutter 21 is switched between an open state in which the subject light captured through the imaging optical system 15 is made to be irradiated on the imaging element 16 and a light-shielding state in which the subject light is shielded. Note that at a time of photographing, the shutter 21 is once kept to be in the light-shielding state, and thereafter, it is switched to the open state. Further, when a previously set period of time elapses after the shutter 21 is switched to the open state, the shutter is again switched to the light-shielding state. Note that the switching of the shutter 21 between the light-shielding state and the open state is executed by a shutter driving section 22.

The imaging element 16 is formed of, for instance, a CCD (Charge Coupled Device), a CMOS (Complementary Metal-Oxide Semiconductor), or the like. The imaging element 16 receives the subject light captured by the imaging optical system 15, converts (photoelectrically converts) a light amount of the received light into a signal charge, and accumulates the converted signal charge. Thereafter, the signal charge accumulated in the imaging element 16 is output to an AFE (Analog Front End) circuit 25.

The AFE circuit 25 is formed by including not-illustrated AGC circuit, CDS circuit and A/D conversion circuit. The AFE circuit 25 performs processing such as gain control and noise removal on the input image signal. After performing these processing, the AFE circuit 25 converts analog image signals into digital image signals. The digital image signals are recorded in an image memory 30 by being collected for each one frame. Note that driving timings of the imaging element 16 and the AFE circuit 25 are controlled by a timing generator whose illustration is omitted.

An image processing circuit 35 performs image processing such as white balance processing, color interpolation process, contour compensation processing and gamma processing, on the image signal stored in the image memory 30. After performing these image processing, the image processing circuit 35 performs format processing to compress the signal in a storage format such as JPEG format, for example. Further, the image processing circuit 35 performs coding processing or decoding processing on the image data. Note that a reference numeral 37 denotes a recording I/F.

An LCD 38 displays, not only an image obtained by the digital camera 10, an image stored in a storage medium 36, and a through image captured during a photographing standby state, but also a setting image used for setting a photographing condition and so on and for changing a setting, and the like. As the image obtained by the digital camera 10 and the image stored in the storage medium 36, moving images, in addition to still images, can be cited. The LCD 38 is controlled by a display control circuit 39. A speaker 40 outputs, when the moving image is displayed on the LCD 38, a sound corresponded to the moving image and the like. A control of the output of the sound in the speaker 40 is executed by a sound control circuit 41.

A sound pickup section 43 is formed of, for example, a microphone, and obtains a sound when performing moving image photographing or recording, for instance. A sound signal obtained by the sound pickup section 43 is recorded in a sound memory 44.

A signal processing apparatus 45 performs processing, on the sound signal obtained by the sound pickup section 43, to reduce a noise sound included in the sound signal. Note that as the noise sound, there can be cited an operation sound generated when respective mechanisms provided inside the digital camera 10 are driven at the time of performing moving image photographing or recording, an operation sound generated when performing operation at the time of driving the various mechanisms, and the like. Further, the signal processing apparatus 45 performs processing for compression-coding the obtained sound signal (including the sound signal on which the aforementioned processing to reduce the noise sound is performed), and processing for decoding the sound signal on which the processing of compression coding is performed.

A CPU 50 executes a control program (illustration is omitted) stored in a built-in memory 51, thereby comprehensively controlling respective sections in the digital camera 10. As the control in the CPU 50, a control based on an operation of a release button 52 and a control based on an operation of a setting operation section 53 can be cited. As the control based on the operation of the release button 52, well-known AE processing and AF processing, imaging processing and the like can be cited. Further, as the control based on the operation of the setting operation section 53, processing such as an initial setting and a setting of photographing condition can be cited.

Further, the CPU 50 performs processing to write image data obtained at the time of photographing in the storage medium 36. For example, when a still image is photographed, the CPU 50 writes image data on which the coding processing is performed in the image processing circuit 35, in the storage medium 36 as one file (still image file) together with model information of the digital camera 10, photographing information at the time of photographing and the like. In like manner, when a moving image is photographed, the coding processing is performed, in the image processing circuit 35, on image data of respective frames obtained through the moving image photographing, and the CPU 50 writes these pieces of image data of respective frames on which the coding processing is performed and sound data on which signal processing is performed in the signal processing apparatus 45, in the storage medium 36 as one file (moving image file) together with model information of the digital camera 10, photographing information at the time of photographing and the like.

Hereinafter, a configuration of the aforementioned signal processing apparatus 45 according to a first embodiment will be described by using a functional block diagram in FIG. 2.

<First embodiment>

Figure 2:
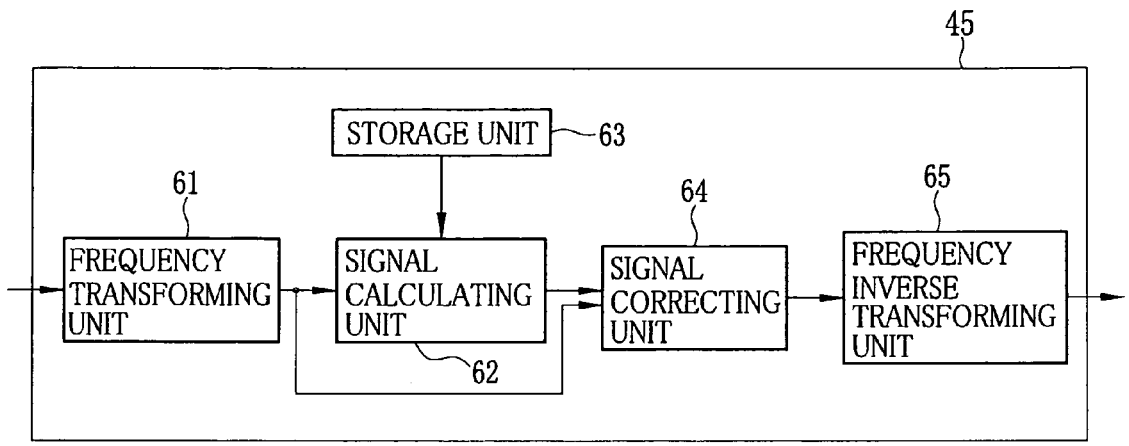
FIG. 2 is a functional block diagram illustrating a configuration of a signal processing apparatus of a first embodiment.

As illustrated in FIG. 2, the signal processing apparatus 45 is provided with a frequency transforming unit 61, a signal calculating unit 62, a storage unit 63, a signal correcting unit 64, and a frequency inverse transforming unit 65.

The frequency transforming unit 61 transforms a sound signal obtained by the sound pickup section 43 from a signal represented by a time function (time dimensional signal) into a signal represented by a frequency function (frequency dimensional signal). First, the frequency transforming unit 61 determines a window width in a later-described window function. After determining the window width in the window function, the frequency transforming unit 61 divides, when the determined window width is set as one frame, the input sound signal so that the number of samples per one frame becomes 1024, for example.

Next, the frequency transforming unit 61 multiplies the signals by a window function such as a Hanning window while shifting the interval of frame by 0.5 frames, and thereafter, it performs a Fourier transforming process on the sound signal to which the window function is applied. As is already known, the window function called Hanning window is a function in which both end values are 0 and a center value is 1, so that a signal multiplied by the window function corresponds to a signal whose center portion is emphasized. For this reason, when a signal of vibration or the like that changes with time is analyzed while shifting the interval of frame by one frame, it is difficult to capture a characteristic part. Accordingly, the analysis is performed by overlapping frames while shifting the interval of frame by 0.5 frames, to thereby detect the characteristic part of the signal. By conducting these processing, the obtained sound signal is converted from the time dimensional signal into the frequency dimensional signal for each one frame with a shift amount of 0.5 frames. The sound signal on which these processing are performed is output to the signal calculating unit 62 and the signal correcting unit 64.

The signal calculating unit 62 performs processing to reduce a noise sound included in the obtained sound signal. As described above, the sound signal obtained by the sound pickup section 43 is formed of a signal in which a sound of target (target sound) and a noise sound (operation sound) are mixed. The signal calculating unit 62 subtracts a signal based on the noise sound (noise signal) from the sound signal output from the frequency transforming unit 61, thereby reducing the noise sound included in the sound signal. The noise signal is formed of a frequency dimensional signal having the same frame width as that of the sound signal output from the frequency transforming unit 61. Further, the noise signal is previously stored in the storage unit 63.

Note that in the present embodiment, the noise signal is previously stored in the storage unit 63, and the noise signal stored in the storage unit 63 is subtracted from the sound signal for each one frame output from the frequency transforming unit 61, but, it is not necessary to be limited to this, and it is also possible to subtract a noise signal multiplied by a coefficient from the sound signal of each frame output from the frequency transforming unit 61.

Further, it is also possible that the noise signal is not previously stored in the storage unit 63, but the noise signal is obtained by using a conventional noise estimation method, and the obtained noise signal or a signal achieved by multiplying the noise signal by a coefficient is subtracted from the sound signal for each one frame output from the frequency transforming unit 61.

The signal correcting unit 64 performs correction on the sound signal whose noise component is reduced by the signal calculating unit 62 (referred to hereinafter as reduction-processed sound signal). In the signal correcting unit 64, a sound signal in which no noise sound is mixed, namely, a sound signal formed only of the target sound among the frequency dimensional signals of respective frames, is input from the frequency transforming unit 61. After setting the sound signal formed only of the target sound as a reference signal, the signal correcting unit 64 multiplies the reference signal by a coefficient. After multiplying the reference signal by the coefficient, the signal correcting unit 64 corrects the reduction-processed sound signal based on the reference signal multiplied by the coefficient. The corrected sound signal after the correction is performed is output to the frequency inverse transforming unit 65. The frequency inverse transforming unit 65 inverse-transforms the corrected sound signal from the signal represented by the frequency function into the signal represented by the time function. The sound signal which is inverse-transformed into the signal represented by the time function is written in the sound memory 44.

Figure 3:
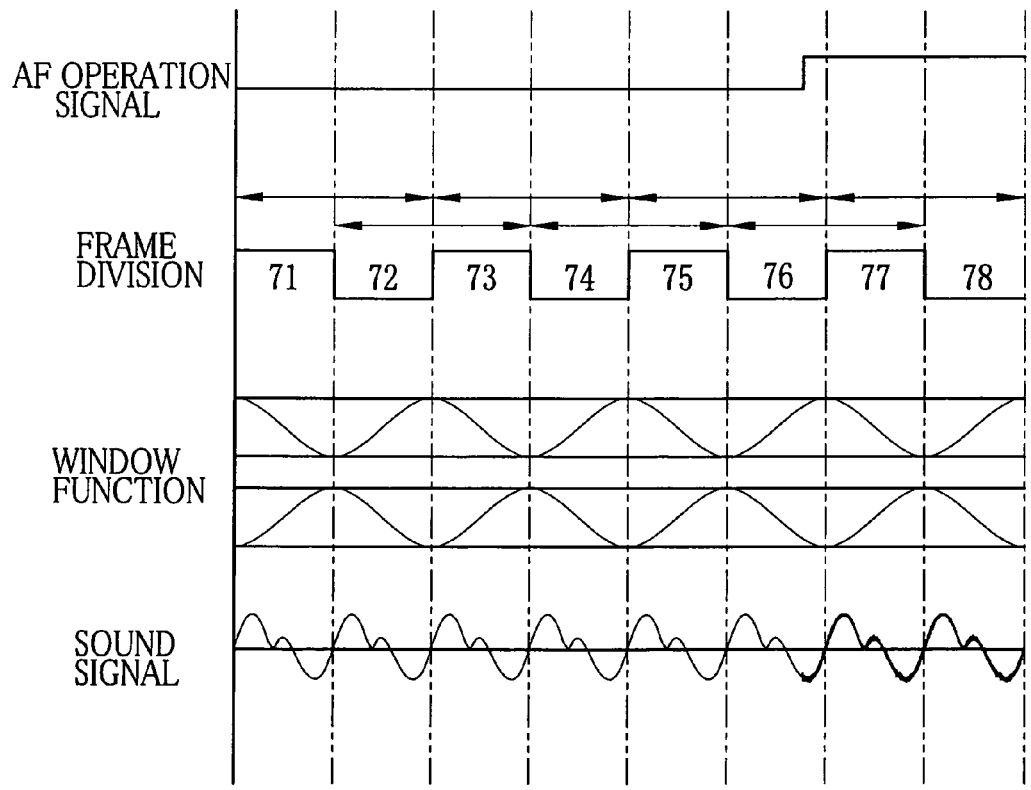
FIG. 3 is a view illustrating a relation among an obtained sound signal, a window function, frame division and an AF operation signal.

Next, the flow of signal processing in the signal processing apparatus 45 will be described using FIG. 3 and FIG. 4. As illustrated in FIG. 3, the sound obtained by the sound pickup section 43 is a periodical signal in a short period of time of about several tens of ms. As described above, when the sound signal is input, the frequency transforming unit 61 sets the window width in the window function, and then performs frame division.

As described above, the frequency transforming unit 61 multiplies the signals by the window function such as a Hanning window while shifting the interval of frame by 0.5 frames, and thereafter, it performs a Fourier transforming process on the sound signal to which the window function is applied. Accordingly, when the aforementioned processing are performed on the sound signal input to the frequency transforming unit 61, a sound signal for each one frame is generated, in an order of a sound signal in which an area denoted by a reference numeral 71 and an area denoted by a reference numeral 72 are set as one frame, and a sound signal in which the area denoted by the reference numeral 72 and an area denoted by a reference numeral 73 are set as one frame, . . . , and the sound signals are output to the signal calculating unit 62. When the sound signal for each one frame is input, the signal calculating unit 62 reads the noise signal formed of the operation sound stored in the storage unit 63, and subtracts the noise signal from the sound signal for each one frame.

For example, when AF (auto-focus) processing is carried out at the time of obtaining a sound in the sound pickup section 43, an AF operation signal is output. When the AF operation signal is output, the lens driving section 18 is driven, and the lens that forms the imaging optical system 15 is moved in the optical axis L direction. When the lens driving section 18 is driven and when the lens that forms the imaging optical system 15 is moved, operation sounds thereof are generated. Accordingly, a sound signal obtained by the sound pickup section 43 is a sound signal in which a target sound and a noise sound are mixed. For instance, if a timing at which the AF operation signal is output is within an area denoted by a reference numeral 76, it can be estimated that a noise component is overlapped with the sound signals in areas behind the area (areas denoted by reference numerals 77, 78).

For example, the sound signal with which the noise component is overlapped can be represented by the following equation (1).

$$x(t)=s(t)+n(t) \tag{1}$$

Here, x(t) is a sound signal obtained by the sound pickup section 43, s(t) is a sound signal of the target sound, and n(t) is a noise signal of the operation sound or the like. Note that these signals are represented by time functions.

By conducting the aforementioned Fourier transform, the sound signal in which the target sound and the noise sound are mixed is transformed from the signal x(t) represented by the time function into a signal X(f) represented by a frequency function. Note that f indicates a frequency.

Here, if the sound signal of the target sound is set as Se(f), the sound signal of the target sound Se(f) can be represented by the following equation (2).

$$|Se(f)|=|X(f)|-\alpha|Ne(f)| \tag{2}$$

Note that Ne(f) is a noise signal, and α is a subtraction coefficient. When the sound signal formed only of the target sound is determined by using the aforementioned equation (2), a frequency characteristic of the signal of target component to be calculated may be changed or a musical noise or the like may be artificially overlapped with the sound signal after the noise signal is subtracted therefrom because of a value of α, depending on an intensity of the noise signal to be subtracted. For this reason, a value of 0.5 to 4 is preferably employed as the value of α.

Figure 4:
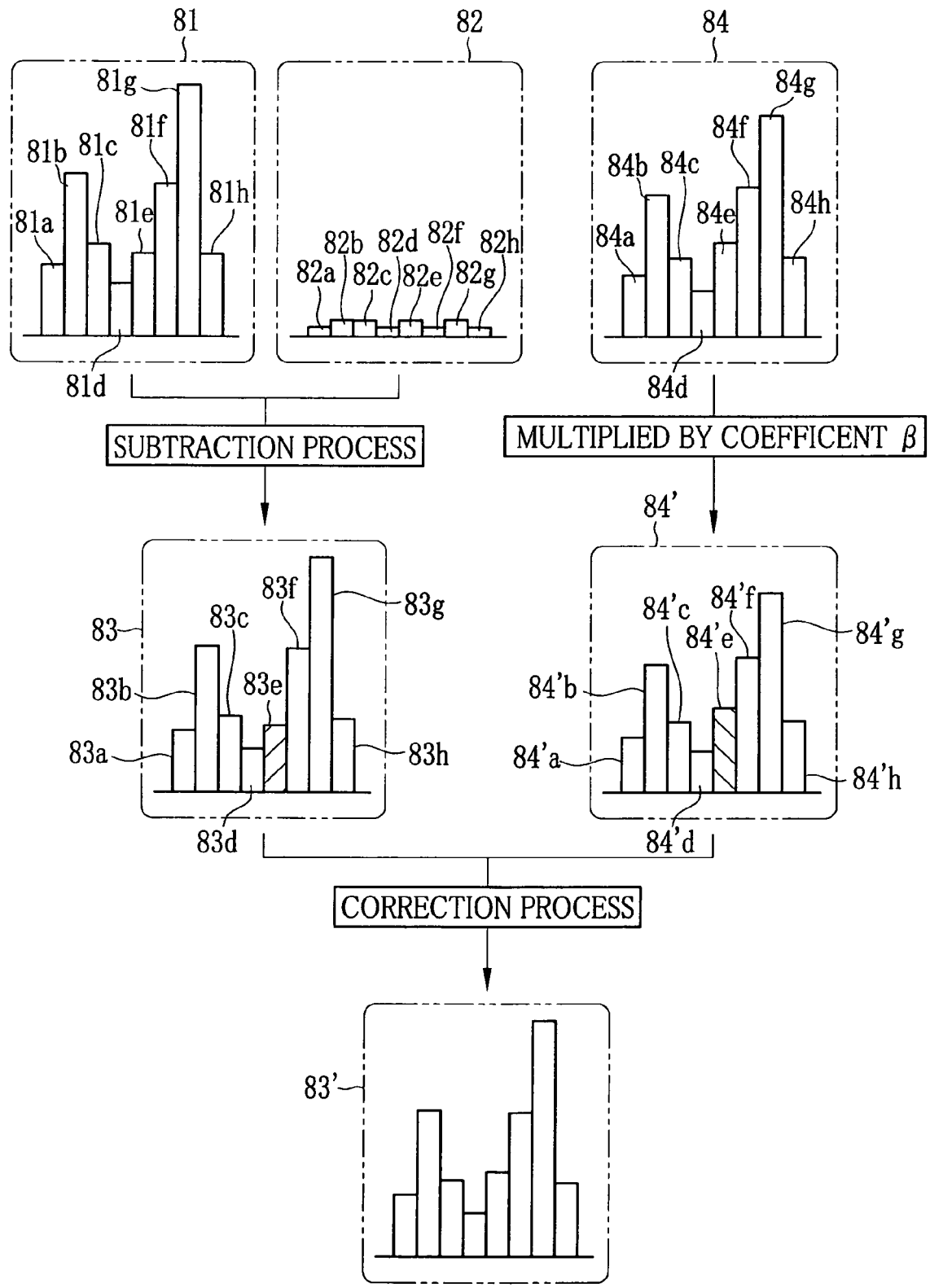
FIG. 4 is a view illustrating a flow of signal processing in the signal processing apparatus of the first embodiment.

FIG. 4 illustrates frequency spectra of respective signals (81, 82, 83, 83', 84, 84'), and in each graph of frequency spectra, a horizontal axis indicates a frequency range, and a vertical axis indicates an intensity of sound (referred to also as "value of frequency spectrum" hereinafter).

Hereinafter, explanation will be made by giving a reference numeral 81 to the obtained sound signal and a reference numeral 82 to the noise signal, as illustrated in FIG. 4. The signal calculating unit 62 reads the noise signal 82 stored in the storage unit 63, and then subtracts frequency spectra 82*a* to 82*h* in the noise signal 82 from frequency spectra 81*a* to 81*h* in the Fourier transformed sound signal 81, respectively, for each frequency range. Through the subtraction process, a reduction-processed sound signal 83 from which the noise component is reduced is generated.

Next, the signal correcting unit 64 generates a signal (reference numeral 84') obtained by multiplying a reference signal 84 by a coefficient β. After generating the signal 84', the signal correcting unit 64 compares frequency spectra in the reference signal 84' multiplied by the coefficient β with frequency spectra in the reduction-processed sound signal 83 for each frequency range. Specifically, the signal correcting unit 64 compares an intensity of sound in each frequency range in the reduction-processed sound signal 83 with an intensity of sound in each corresponding frequency range in the reference signal 84' multiplied by the coefficient β.

For example, when an intensity of sound in a certain frequency range in the reduction-processed sound signal 83 is less than a value of an intensity of sound in a corresponding frequency range in the reference signal 84' multiplied by the coefficient β, a value of the intensity of sound in the frequency range in the reduction-processed sound signal 83 is replaced with the value of the intensity of sound in the corresponding frequency range in the reference signal 84' multiplied by the coefficient β.

In like manner, when an intensity of sound in a certain frequency range in the reduction-processed sound signal 83 exceeds a value of an intensity of sound in a corresponding frequency range in the reference signal 84' multiplied by the coefficient β, a value of the intensity of sound in the frequency range in the reduction-processed sound signal 83 is replaced with the value of the intensity of sound in the corresponding frequency range in the reference signal 84' multiplied by the coefficient β.

Note that FIG. 4 illustrates a case in which a value of a frequency spectrum 83$e$ (intensity of sound) in the reduction-processed sound signal 83 is less than a value of a frequency spectrum 84'$e$ in the reference signal 84' multiplied by the coefficient β. In this case, the signal correcting unit 64 replaces the value of the frequency spectrum 83$e$ in the reduction-processed sound signal 83 with the value of the frequency spectrum 84'$e$ among respective frequency ranges in the reference signal 84' multiplied by the coefficient β.

Accordingly, a sound signal on which a correction process is performed (corrected sound signal) 83' is generated. The corrected sound signal 83' is transformed, through inverse Fourier transform or the like performed by the frequency inverse transforming unit 65, from the signal represented by the frequency function into the signal represented by the time function. Note that since a frequency dimensional signal of each frame is generated through a Fourier transforming process performed while shifting the interval of frame by 0.5 frames, the sound signals represented by the time functions and on which an inverse Fourier transforming process is performed by the frequency inverse transforming unit 65 are connected with one another with a shift amount of 0.5 frames.

As described above, the component of operation sound generated when the mechanism inside the camera is driven is subtracted from the sound signal to generate the sound signal from which an influence of the operation sound is reduced, and thereafter, the sound signal from which the influence of the operation sound is reduced is corrected based on the sound signal formed only of the target sound. Accordingly, it is possible to prevent the generation of musical noise which is generated when an operation sound formed of a sound whose characteristic is different from that of the original operation sound is estimated as the noise sound. As above, in the present embodiment, it is possible to appropriately reduce the noise sound included in the obtained sound signal.

In the first embodiment, as a requirement when the operation sound as the noise sound is generated, the timing at which the AF operation signal is output is cited, but, other than that, there can be cited a timing at which an operation signal of an operation section provided in the digital camera such as an operation signal which is output when an operation section such as a zoom button is operated is output, a timing at which a driving signal of an aperture driving section that is driven at the time of changing an aperture value is output, a timing at which, if a digital camera provided with a camera-shake compensation function is used, a start signal of camera-shake compensation process is output, and the like.

In the first embodiment, in the comparison of the frequency spectra for each frequency range, when a value of a frequency spectrum (intensity of sound) in a certain frequency range in the reduction-processed sound signal 83 is less than a value of a frequency spectrum in a corresponding frequency range in the reference signal 84' multiplied by the coefficient β, the value of the frequency spectrum in the frequency range in the reduction-processed sound signal is replaced with the value of the frequency spectrum in the corresponding frequency range in the reference signal multiplied by the coefficient β, but, it is not necessary to be limited to this.

For example, it is also possible that when a value of a frequency spectrum in a certain frequency range in the reduction-processed sound signal is less than a value of a frequency spectrum in a corresponding frequency range in the reference signal multiplied by the coefficient β, the value of the frequency spectrum in the frequency range in the reduction-processed sound signal is corrected to a value which is greater than the value of the frequency spectrum in the corresponding frequency range in the reference signal multiplied by the coefficient β. In this case, it is only required to previously calculate a ratio between values of frequency spectra in adjacent frequency ranges in the reduction-processed sound signal 83 and the reference signal 84' multiplied by the coefficient β, respectively, and to correct the value of the frequency spectrum in the reduction-processed sound signal 83 so that the ratios between the values of the frequency spectra in the adjacent frequency ranges match.

Further, the same applies to the case where a value of a frequency spectrum in a certain frequency range in the reduction-processed sound signal exceeds a value of a frequency spectrum in a corresponding frequency range in the reference signal multiplied by the coefficient β, in which it is also possible that the value of the frequency spectrum in the frequency range in the reduction-processed sound signal is not replaced with the value of the frequency spectrum in the corresponding frequency range in the reference signal multiplied by the coefficient β but is corrected to a value which is less than the value of the frequency spectrum in the corresponding frequency range in the reference signal multiplied by the coefficient β. The correction to make the ratios between the values of the frequency spectra in the adjacent frequency ranges match is also possible to be conducted in the same manner.

In the first embodiment, the frequency spectrum in each frequency range in the reference signal is multiplied by the coefficient β and the frequency spectrum for each frequency range in the reference signal multiplied by the coefficient β and the frequency spectrum for each frequency range in the reduction-processed sound signal are compared for each frequency range, and as a result of comparison, by setting a frequency range having a different value of frequency spectrum as a correction-target frequency range, the frequency spectrum in the correction-target frequency range in the reduction-processed sound signal is corrected. Further, the frequency spectrum in the correction-target frequency range in the reduction-processed sound signal is corrected based on the frequency spectrum in the corresponding frequency range (correction-target frequency range) in the reference signal multiplied by the coefficient β. However, the way of correcting the frequency spectrum is not limited to this, and it is also possible that either one of a simple average value, a weighted average value, a maximum value and a minimum value of values of frequency spectra in a plurality of frequency ranges including the correction-target frequency range (for example, frequency ranges adjacent to the correction-target frequency range) among the frequency ranges in the reference signal is determined, and by setting the determined value as a limit value, the value of the frequency spectrum in the correction-target frequency range among the frequency spectra in the reduction-processed sound signal is corrected based on the limit value. Hereinafter, description will be made on a case where the simple average value is used. Note that the number of frequency spectra used for determining the simple average value can be appropriately set.

Figure 5:
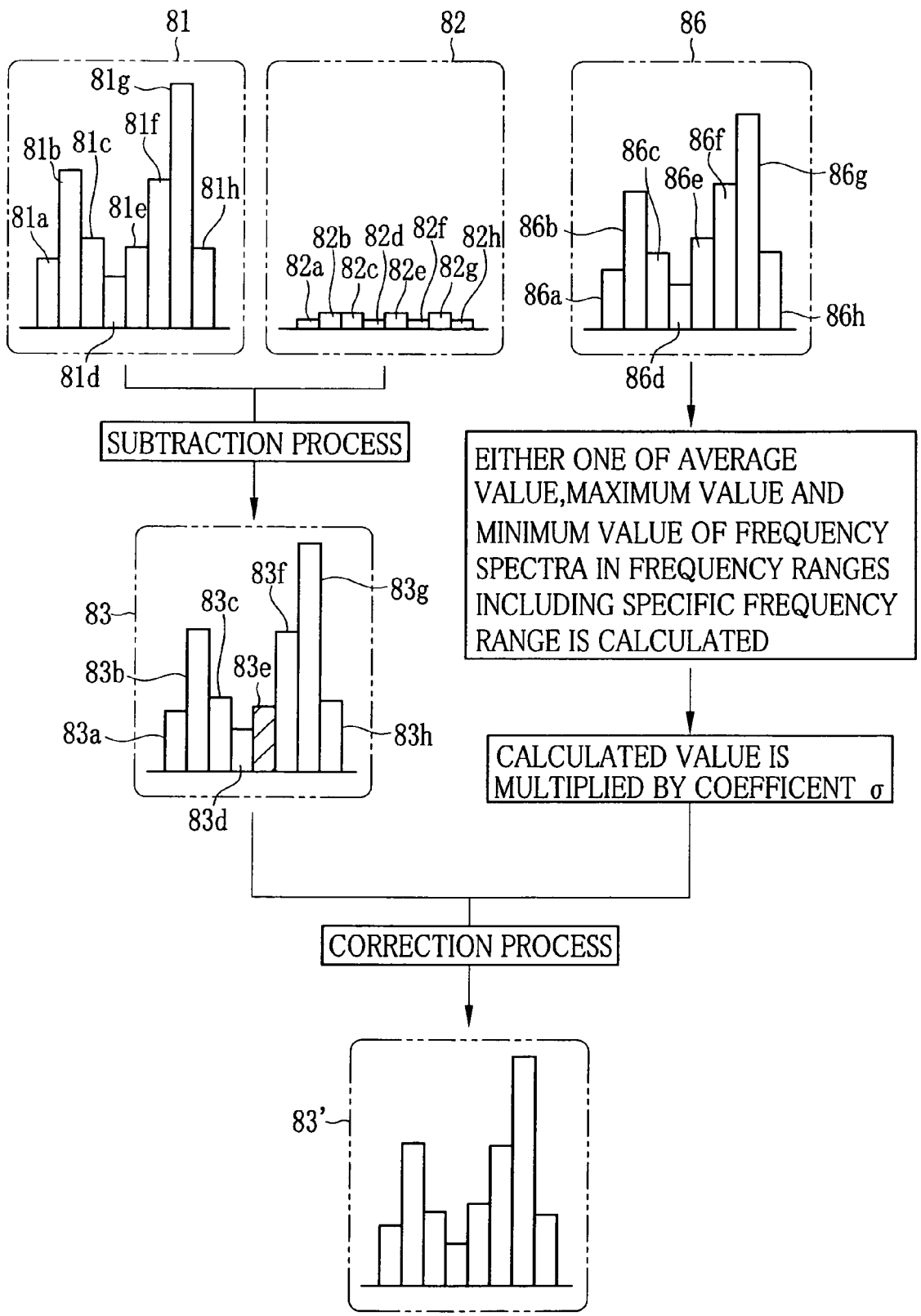
FIG. 5 is a view illustrating a flow of signal processing in a modified example of the first embodiment.

Description will be made on a case in which a frequency range of the frequency spectrum 83e among the frequency spectra in the respective frequency ranges in the reduction-processed sound signal 83 is the correction-target frequency range, for example, as illustrated in FIG. 5. The signal correcting unit 64 reads values of frequency spectra (for example, frequency spectra 86d, 86e, 86f) in a plurality of frequency ranges including a frequency range of the frequency spectrum 83e among the frequency spectra in the respective frequency ranges in the reference signal, and calculates a simple average value of these frequency spectra. Subsequently, the signal correcting unit 64 multiplies the calculated simple average value by a coefficient σ, thereby calculating a limit value. Next, the signal correcting unit 64 compares the calculated limit value with the value of the frequency spectrum in the target frequency range.

In the comparison described above, if the value of the frequency spectrum 83e is less than the calculated limit value or the value exceeds the calculated limit value, for example, the signal correcting unit 64 replaces the value of the frequency spectrum 83e with the limit value.

In the first embodiment, the value obtained by multiplying the frequency spectrum in each frequency range in the reference signal by the coefficient β is set as the limit value in each frequency range, and the correction is conducted by setting the limit value as an upper limit or a lower limit. However, it is also possible that the value obtained by multiplying the frequency spectrum in each frequency range in the reference signal by the coefficient β is set, not as the limit value, but as a target value, and then the value of the frequency spectrum to be a correction target among the frequency spectra in the reduction-processed sound signal is corrected to be approximated to the target value.

Hereinafter, a configuration of the aforementioned signal processing apparatus 45 according to a second embodiment will be described by using a functional block diagram in FIG. 6.

<Second embodiment>

Figure 6:
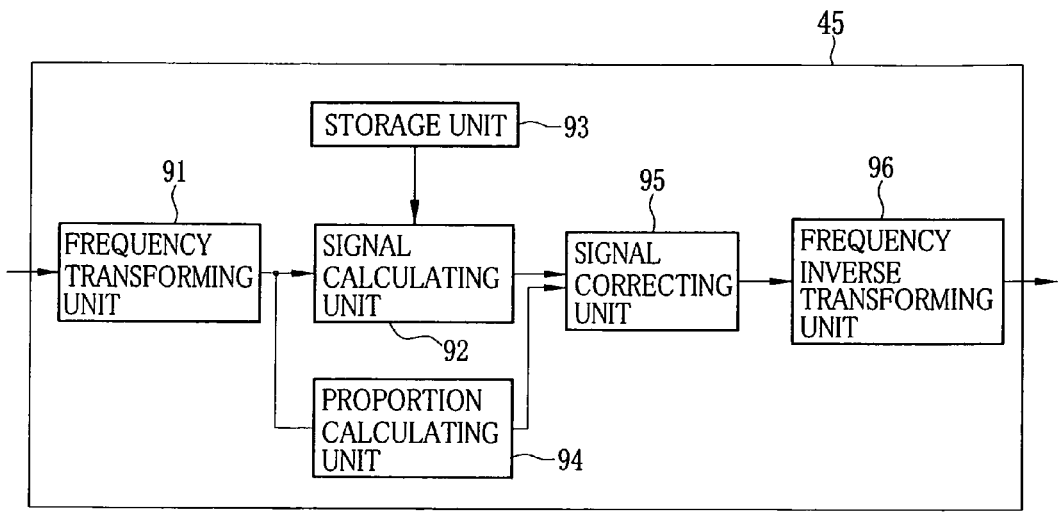
FIG. 6 is a functional block diagram illustrating a configuration of a signal processing apparatus of a second embodiment.

As illustrated in FIG. 6, the signal processing apparatus 45 is provided with a frequency transforming unit 91, a signal calculating unit 92, a storage unit 93, a proportion calculating unit 94, a signal correcting unit 95, and a frequency inverse transforming unit 96.

The frequency transforming unit 91 transforms a sound signal obtained by the sound pickup section 43 from a signal represented by a time function (time dimensional signal) into a signal represented by a frequency function (frequency dimensional signal). First, the frequency transforming unit 91 determines a window width in a later-described window function. After determining the window width in the window function, the frequency transforming unit 91 divides, when the determined window width is set as one frame, the input sound signal so that the number of samples per one frame becomes 1024, for example.

Next, the frequency transforming unit 91 multiplies the signals by a window function such as a Hanning window while shifting the interval of frame by 0.5 frames, and thereafter, it performs a Fourier transforming process on the sound signal to which the window function is applied. As is already known, the window function called Hanning window is a function in which both end values are 0 and a center value is 1, so that a signal multiplied by the window function corresponds to a signal whose center portion is emphasized. For this reason, when a signal of vibration or the like that changes with time is analyzed while shifting the interval of frame by one frame, it is difficult to capture a characteristic part. Accordingly, the analysis is performed by overlapping frames while shifting the interval of frame by 0.5 frames, to thereby detect the characteristic part of the signal. By conducting these processing, the obtained sound signal is converted from the time dimensional signal into the frequency dimensional signal for each one frame with a shift amount of 0.5 frames. The sound signal on which these processing are performed is output to the signal calculating unit 92 and the signal correcting unit 95.

The signal calculating unit 92 performs processing to reduce a noise sound included in the obtained sound signal. As described above, the sound signal obtained by the sound pickup section 43 is formed of a signal in which a sound of target (target sound) and a noise sound (operation sound) are mixed. The signal calculating unit 92 subtracts a signal based on the noise sound (noise signal) from the sound signal output from the frequency transforming unit 91, thereby reducing the noise sound included in the sound signal. The noise signal is formed of a frequency dimensional signal having the same frame width as that of the sound signal output from the frequency transforming unit 91. Further, the noise signal is previously stored in the storage unit 93.

Note that in the present embodiment, the noise signal is previously stored in the storage unit 93, and the noise signal stored in the storage unit 93 is subtracted from the sound signal for each one frame output from the frequency transforming unit 91, but, it is not necessary to be limited to this, and it is also possible to subtract a noise signal multiplied by a coefficient from the sound signal of each frame output from the frequency transforming unit 91.

Further, it is also possible that the noise signal is not previously stored in the storage unit 93, but the noise signal is obtained by using a conventional noise estimation method, and the obtained noise signal or a signal achieved by multiplying the noise signal by a coefficient is subtracted from the sound signal for each one frame output from the frequency transforming unit 91.

The proportion calculating unit 94 determines, when the sound signal formed only of the target sound is set as a reference signal, a proportion of an intensity of the input sound signal for each one frame with respect to an intensity of the sound signal being the reference signal. As described above, the sound signal for each one frame is transformed, by the frequency transforming unit 91, into a frequency dimensional signal, in other words, a signal represented by a relation between a frequency range and a value of frequency spectrum (intensity of sound in the frequency range). The proportion calculating unit 94 calculates a total sum A0 of values of frequency spectra in respective frequency ranges in the reference signal and a total sum A1 of values of frequency spectra in respective frequency ranges in the sound signal, respectively. After calculating these values, the proportion calculating unit 94 determines a proportion B of an intensity of the sound signal with respect to an intensity of the sound signal based on an equation of B=A1/A0. Specifically, by determining the proportion B, it is possible to judge whether or not the intensity of the obtained sound signal is changed. Note that the proportion calculating unit 94 outputs the determined proportion B and the reference signal to the signal correcting unit 95.

The signal correcting unit 95 performs correction on the sound signal whose noise component is reduced by the signal calculating unit 92 (referred to hereinafter as reduction-processed sound signal). First, the signal correcting unit 95 multiplies the reference signal by the proportion B determined by the proportion calculating unit 94. Thereafter, the signal correcting unit 95 corrects the reduction-processed sound signal based on the reference signal multiplied by the proportion B. The corrected sound signal after the correction is performed is output to the frequency inverse transforming unit 96. The frequency inverse transforming unit 96 inverse-transforms the corrected sound signal from the frequency dimensional signal into the time dimensional signal. The sound signal which is inverse-transformed into the time dimensional signal is written in the sound memory 44.

Figure 7:
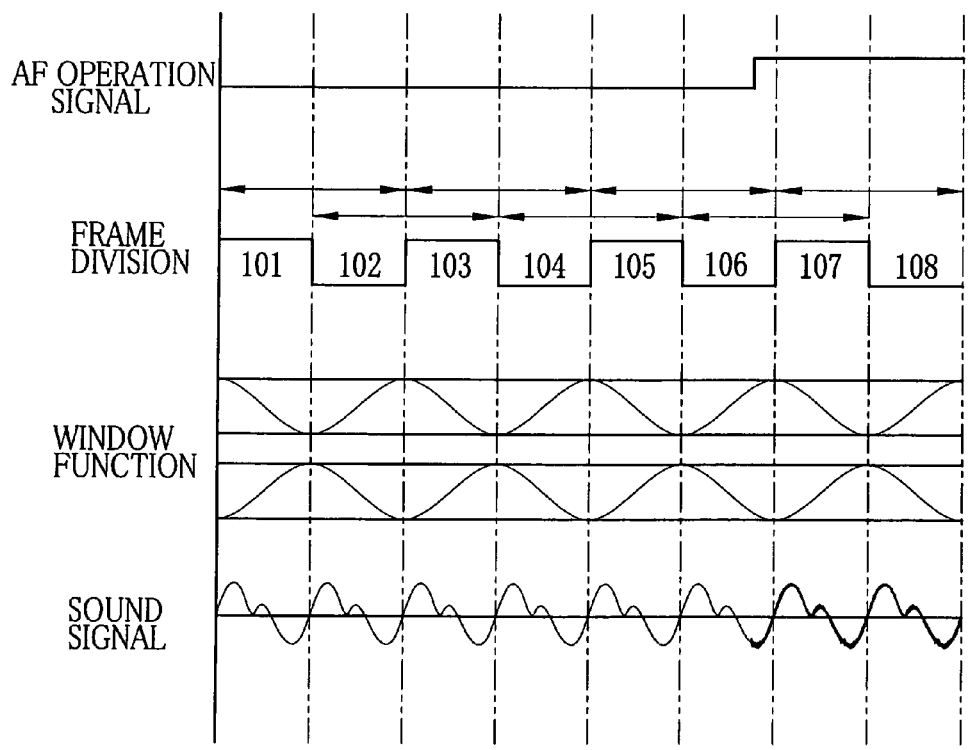
FIG. 7 is a view illustrating a relation among an obtained sound signal, a window function, frame division and an AF operation signal.

Next, the flow of signal processing in the signal processing apparatus 45 will be described using FIG. 7 and FIG. 8. As illustrated in FIG. 7, the sound obtained by the sound pickup section 43 is a periodical signal in a short period of time of about several tens of ms. As described above, when the sound signal is input, the frequency transforming unit 91 sets the window width in the window function, and then performs frame division.

As described above, the frequency transforming unit 91 multiplies the signals by the window function such as a Hanning window while shifting the interval of frame by 0.5 frames, and thereafter, it performs a Fourier transforming process on the sound signal to which the window function is applied. Accordingly, when the aforementioned processing are performed on the sound signal input to the frequency transforming unit 91, a sound signal for each one frame is generated, in an order of a sound signal in which an area denoted by a reference numeral 101 and an area denoted by a reference numeral 102 are set as one frame, and a sound signal in which the area denoted by the reference numeral 102 and an area denoted by a reference numeral 103 are set as one frame, . . . , and the sound signals are output to the signal calculating unit 92. When the sound signal for each one frame is input, the signal calculating unit 92 reads the noise signal formed of the operation sound stored in the storage unit 93, and subtracts the noise signal from the sound signal for each one frame.

For example, when AF (auto-focus) processing is carried out at the time of obtaining a sound in the sound pickup section 43, an AF operation signal is output. When the AF operation signal is output, the lens driving section 18 is driven, and the lens that forms the imaging optical system 15 is moved in the optical axis L direction. When the lens driving section 18 is driven and when the lens that forms the imaging optical system 15 is moved, operation sounds thereof are generated. Accordingly, a sound signal obtained by the sound pickup section 43 is a sound signal in which a target sound and a noise sound are mixed. For instance, if a timing at which the AF operation signal is output is within an area denoted by a reference numeral 106, it can be estimated that a noise component is overlapped with the sound signals in areas behind the area (reference numerals 107, 108).

For example, the sound signal with which the noise component is overlapped can be represented by the following equation (3).

$$x(t)=s(t)+n(t) \tag{3}$$

Here, x(t) is a sound signal obtained by the sound pickup section 43, s(t) is a sound signal of the target sound, and n(t) is a noise signal of the operation sound or the like. Note that these signals are represented by time functions.

By conducting the aforementioned Fourier transform, the sound signal in which the target sound and the noise sound are mixed is transformed from the signal x(t) represented by the time function into a signal X(f) represented by a frequency function. Note that f indicates a frequency.

Here, if the sound signal of the target sound is set as Se(f), the sound signal of the target sound Se(f) can be represented by the following equation (4).

$$|Se(f)|=|X(f)|-\alpha|Ne(f) \tag{4}$$

Note that Ne(f) is a noise signal, and α is a subtraction coefficient. When the sound signal formed only of the target sound is determined by using the aforementioned equation (4), a frequency characteristic of the signal of target component to be calculated may be changed or a musical noise or the like may be artificially overlapped with the sound signal after the noise signal is subtracted therefrom because of a value of α, depending on an intensity of the noise signal to be subtracted. For this reason, a value of 0.5 to 4 is preferably employed as the value of α.

FIG. 8 illustrates frequency spectra of respective signals (111, 112, 113, 113', 114, 114'), and in each graph of frequency spectra, a horizontal axis indicates a frequency range, and a vertical axis indicates an intensity of sound (referred to also as "value of frequency spectrum" hereinafter).

Hereinafter, explanation will be made by giving a reference numeral 111 to the obtained sound signal and a reference numeral 112 to the noise signal, as illustrated in FIG. 8. The signal calculating unit 92 reads the noise signal 112 stored in the storage unit 93, and then subtracts frequency spectra 112*a* to 112*h* in the noise signal 112 from frequency spectra 111*a* to 111*h* in the Fourier transformed sound signal 111, respectively, for each corresponding frequency range. Through the subtraction process, a reduction-processed sound signal 113 from which the noise component is reduced is generated.

Next, the proportion calculating unit 94 determines a total sum A0 of magnitudes of frequency spectra 114*a* to 114*h* in all of frequency ranges in a reference signal 114 and a total sum A1 of magnitudes of the frequency spectra 111*a* to 111*h* in all of the frequency ranges in the obtained sound signal 111. After determining these total sums A0, A1, the signal correcting unit 95 calculates a proportion B from an equation of B=A1/A0.

The signal correcting unit 95 generates a signal (reference numeral 114') obtained by multiplying the values of spectra in the respective frequency ranges in the reference signal 114 by the proportion B calculated by the proportion calculating unit 94. Subsequently, the signal correcting unit 95 compares the reference signal 114' multiplied by the proportion B with the reduction-processed sound signal 113. In the comparison, it is compared whether or not the value of each of frequency spectra 113*a* to 113*h* in the reduction-processed sound signal 113 is a value included in a predetermined error range of the value of each of frequency spectra 114'*a* to 114'*h* in the reference signal 114' multiplied by the proportion B, in the same frequency range. Specifically, if the value of the frequency spectrum in the reduction-processed sound signal 113 is set as S1 and the value of the frequency spectrum in the reference signal 114 multiplied by the proportion B is set as S0, it is determined whether or not the values satisfy an equation of S0−K≤S1≤S0+K (K is an error). Note that a value of the error K can be appropriately set. FIG. 8 illustrates a case where values of the frequency spectrum 113$f$ and the frequency spectrum 113$g$ among the frequency spectra 113$a$ to 113$h$ in the reduction-processed sound signal 113 do not satisfy the aforementioned equation.

In this case, the signal correcting unit 95 determines a ratio between a total sum of the values of the frequency spectra 113$a$ to 113$h$ in all of the frequency ranges in the reduction-processed sound signal 113 and the value of the frequency spectrum 113$f$ to be a target and a ratio between the total sum and the value of the frequency spectrum 113$g$ to be a target. Specifically, the signal correcting unit 95 determines a ratio between the total sum of the values of the frequency spectra 113$a$ to 113$h$ and the value of the frequency spectrum 113$f$ (first intensity ratio) and a ratio between the total sum of the values of the frequency spectra 113$a$ to 113$h$ and the value of the frequency spectrum 113$g$ (second intensity ratio). Further, the signal correcting unit 95 determines a ratio between a total sum of the values of the frequency spectra 114'$a$ to 114'$h$ in all of the frequency ranges in the reference signal 114' multiplied by the proportion B and the value of the frequency spectrum 114'$f$ to be a target and a ratio between the total sum and the value of the frequency spectrum 114'$g$ to be a target. Specifically, the signal correcting unit 95 determines a ratio between the total sum of the values of the frequency spectra 114'$a$ to 114'$h$ and the value of the frequency spectrum 114'$f$ (third intensity ratio) and a ratio between the total sum of the values of the frequency spectra 114'$a$ to 114'$h$ and the value of the frequency spectrum 114'$g$ (fourth intensity ratio). Subsequently, the signal correcting unit 95 corrects the value of the frequency spectrum 113$f$ to be a target so that the first intensity ratio becomes equal to the third intensity ratio. Further, the signal correcting unit 95 corrects the value of the frequency spectrum 113$g$ to be a target so that the second intensity ratio becomes equal to the fourth intensity ratio. As above, a corrected sound signal 113' is generated. In FIG. 8, the correction is made, through the correction process, so that the value of the frequency spectrum 113$f$ in the reduction-processed sound signal 113 becomes large and the value of the frequency spectrum 113$g$ becomes small, to thereby generate the sound signal 113'.

The corrected sound signal 113' is transformed, through inverse Fourier transform or the like performed by the frequency inverse transforming unit 96, from the signal represented by the frequency function into the signal represented by the time function. Note that since the aforementioned signal correction is carried out for each one frame with a shift amount of 0.5 frames, the sound signals represented by the time functions and on which an inverse Fourier transforming process is performed by the frequency inverse transforming unit 96 are connected with one another with a shift amount of 0.5 frames, and then written in the sound memory 44.

As described above, the component of operation sound generated when the mechanism inside the camera is driven is subtracted from the sound signal to generate the sound signal from which an influence of the operation sound is reduced, and thereafter, the sound signal from which the influence of the operation sound is reduced is corrected based on the sound signal formed only of the target sound. At this time, by determining the proportion between the intensity of the reference signal and the intensity of the sound signal, it is possible to judge whether or not the intensity of the sound signal is changed, and further, by multiplying the sound signal by the proportion, it also becomes possible to deal with a case where the intensity of the sound signal is changed. Further, since it is possible to correct the sound signal from which the noise signal is reduced based on the reference signal multiplied by the proportion, it is possible to prevent the generation of musical noise which is generated in the sound signal from which the noise signal is reduced. As above, in the present embodiment, even if the sound signal is the one whose intensity is changed, it is possible to appropriately reduce the noise sound included in the sound signal.

Also in the second embodiment, similar to the first embodiment, as a requirement when the operation sound as the noise sound is generated, the timing at which the AF operation signal is output is cited, but, other than that, there can be cited a timing at which an operation signal of an operation section provided in the digital camera such as an operation signal which is output when an operation section such as a zoom button is operated is output, and a timing at which, if a digital camera provided with a camera-shake compensation function is used, a start signal of camera-shake compensation process is output.

In the second embodiment, the intensity ratio is calculated from the ratio between the total sum of the values of the frequency spectra in all of the frequency ranges in the sound signal and the value of the frequency spectrum to be a correction target, but, it is not necessary to be limited to this, and it is also possible to determine the intensity ratio from a ratio between an average value of the values of the frequency spectra in all of the frequency ranges in the sound signal and the value of the frequency spectrum to be a correction target, for example. Further, it is also possible to determine the aforementioned intensity ratio by using, not the total sum of the values of the frequency spectra in all of the frequency ranges in the sound signal, but a total sum or an average value of the value of the frequency spectrum to be a correction target and values of frequency spectra in frequency ranges in the vicinity of the frequency range of the frequency spectrum. Further, instead of determining the aforementioned total sum or average value, it is also possible to use a ratio between the value of the frequency spectrum in the frequency range to be a correction target and values of frequency spectra in frequency ranges adjacent to the frequency spectrum.

In the second embodiment, the correction is made on the value of the frequency spectrum to be a correction target so that the intensity ratio determined from the reduction-processed sound signal and the intensity ratio determined from the reference signal 114 multiplied by the proportion B become equal, but, it is not necessary to be limited to this, and it is also possible to correct the frequency spectrum to be a correction target so that the intensity ratio determined from the reduction-processed sound signal is included in an error range of the intensity ratio determined from the reference signal 114 multiplied by the proportion B. In this case, as a value of the error, one that is calculated based on the value K which is used when comparing the value of the frequency spectrum in the reduction-processed sound signal 113 with the value of the frequency spectrum in the reference signal 114 multiplied by the proportion B can be used, for example.

Further, it is not necessary to calculate the intensity ratio based on the reduction-processed sound signal 113 and the intensity ratio based on the reference signal 114 multiplied by the proportion B, and it is also possible to perform correction so that the value of the frequency spectrum in the reduction-processed sound signal is included in an error range of the value of the frequency spectrum in the reference signal 114 multiplied by the proportion B.

In the above-described embodiments, explanation is made by citing the sound signal, as an example, obtained at the time of photographing a moving image, but, it is not necessary to be limited to this, and the present application can be applied also to a case where only a sound signal is obtained, for example. Specifically, the present application can be applied to electronics devices having a recording function. Further, explanation is made by citing, as an example, a digital camera as an apparatus that performs moving image photographing, but, it is also possible to employ, other than the digital camera, a mobile terminal such as a mobile phone and a PDA. Further, it is also possible to employ a program which can make a computer execute respective functions of the signal processing apparatus illustrated in FIG. 2 and FIG. 6. In this case, the program is preferably stored in a computer-readable storage medium such as a memory card, an optical disk and a magnetic disk.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A signal processing apparatus, comprising:
    a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;
    a calculating unit determining a third sound signal which has a reduced influence of the operation sound by using the second sound signal and a sound signal representing the operation sound;
    a correcting unit performing a correction, by setting a sound signal representing the target sound among the second sound signal as a reference signal, on a frequency characteristic of the third sound signal based on a frequency characteristic of the reference signal; and
    a signal inverse transforming unit inverse-transforming a sound signal on which the correction is performed by the correcting unit from the sound signal represented by the frequency function into the sound signal represented by the time function,
    wherein:
    the frequency characteristic is a frequency spectrum; and
    the correcting unit replaces the value of the frequency spectrum of the third sound signal with the value of a corresponding frequency spectrum of the reference signal multiplied by the coefficient when the value of the frequency spectrum of the third sound signal is different from the value of the corresponding frequency spectrum.

2. A signal processing apparatus, comprising:
    a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;
    a calculating unit determining a third sound signal which has a reduced influence of the operation sound by using the second sound signal and a sound signal representing the operation sound;
    a correcting unit performing a correction, by setting a sound signal representing the target sound among the second sound signal as a reference signal, on a frequency characteristic of the third sound signal based on a frequency characteristic of the reference signal; and
    a signal inverse transforming unit inverse-transforming a sound signal on which the correction is performed by the correcting unit from the sound signal represented by the frequency function into the sound signal represented by the time function,
    wherein:
    the frequency characteristic is a frequency spectrum;
    the correcting unit performs a correction on the third sound signal based on a result obtained by comparing a value of a frequency spectrum in each frequency range of the third sound signal with a value of a frequency spectrum in a corresponding frequency range of the reference signal multiplied by a coefficient; and
    the correcting unit performs a correction on the value of the frequency spectrum of the third sound signal to prevent the value from being lower than the value of a corresponding frequency spectrum of the reference signal multiplied by the coefficient when the value of the frequency spectrum of the third sound signal is less than the value of the corresponding frequency spectrum.

3. A signal processing apparatus, comprising:
    a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;
    a calculating unit determining a third sound signal which has a reduced influence of the operation sound by using the second sound signal and a sound signal representing the operation sound;
    a correcting unit performing a correction, by setting a sound signal representing the target sound among the second sound signal as a reference signal, on a frequency characteristic of the third sound signal based on a frequency characteristic of the reference signal; and
    a signal inverse transforming unit inverse-transforming a sound signal on which the correction is performed by the correcting unit from the sound signal represented by the frequency function into the sound signal represented by the time function,
    wherein:
    the frequency characteristic is a frequency spectrum;
    the correcting unit performs a correction on the third sound signal based on a result obtained by comparing a value of a frequency spectrum in each frequency range of the third sound signal with a value of a frequency spectrum in a corresponding frequency range of the reference signal multiplied by a coefficient; and
    the correcting unit performs a correction on the value of the frequency spectrum of the third sound signal to prevent the value from exceeding the value of a corresponding frequency spectrum of the reference signal multiplied by the coefficient when the value of the frequency spectrum of the third sound signal exceeds the value of the corresponding frequency spectrum.

4. A signal processing apparatus, comprising:
a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;
a calculating unit determining a third sound signal which has a reduced influence of the operation sound by using the second sound signal and a sound signal representing the operation sound;
a correcting unit performing a correction, by setting a sound signal representing the target sound among the second sound signal as a reference signal, on a frequency characteristic of the third sound signal based on a frequency characteristic of the reference signal; and
a signal inverse transforming unit inverse-transforming a sound signal on which the correction is performed by the correcting unit from the sound signal represented by the frequency function into the sound signal represented b the time function,
wherein:
the frequency characteristic is a frequency spectrum;
the correcting unit performs a correction on the third sound signal based on a result obtained by comparing a value of a frequency spectrum in each frequency range of the third sound signal with a value of a frequency spectrum in a corresponding frequency range of the reference signal multiplied by a coefficient; and
the correcting unit replaces the value of the frequency spectrum of the third sound signal with a correction value being calculated by using the value of a corresponding frequency spectrum of the reference signal multiplied by the coefficient and values of frequency spectra in frequency ranges in a vicinity thereof among frequency spectra of the reference signal multiplied by the coefficient when the value of the frequency spectrum of the third sound signal is different from the value of the corresponding frequency spectrum.

5. The signal processing apparatus according to claim 4, wherein
the correction value is any one of an average of the value of the corresponding frequency spectrum and the values of the frequency spectra in the frequency ranges in the vicinity thereof, a maximum value among the value of the corresponding frequency spectrum and the values of the frequency spectra in the frequency ranges in the vicinity thereof, and a minimum value among the value of the corresponding frequency spectrum and the values of the frequency spectra in the frequency ranges in the vicinity thereof.

6. A signal processing apparatus, comprising:
a signal transforming unit transforming a first sound signal for each predetermined time width obtained by dividing a sound signal by the predetermined time width into a second sound signal re resented b a frequency function, the sound signal being represented by a time function and in which a target sound and an operation sound are mixed;
a calculating unit determining a third sound signal which has a reduced influence of the operation sound by using the second sound signal and a sound signal representing the operation sound;
a correcting unit performing a correction, by setting a sound signal representing the target sound among the second sound signal as a reference signal, on a frequency characteristic of the third sound signal based on a frequency characteristic of the reference signal; and
a signal inverse transforming unit inverse-transforming a sound signal on which the correction is performed by the correcting unit from the sound signal represented by the frequency function into the sound signal represented by the time function,
wherein:
the frequency characteristic is a frequency spectrum;
the correcting unit performs a correction on the third sound signal based on a result obtained by comparing a value of a frequency spectrum in each frequency range of the third sound signal with a value of a frequency spectrum in a corresponding frequency range of the reference signal multiplied by a coefficient; and
the correcting unit performs a correction on the value of the frequency spectrum of the third sound signal to prevent the value from exceeding a correction value being calculated by using the value of a corresponding frequency spectrum of the reference signal multiplied by the coefficient and values of frequency spectra in frequency ranges in a vicinity thereof among frequency spectra of the reference signal multiplied by the coefficient when the value of the frequency spectrum of the third sound signal exceeds the value of the corresponding frequency spectrum.

7. The signal processing apparatus according to claim 6, wherein
the correction value is any one of an average of the value of the corresponding frequency spectrum and the values of the frequency spectra in the frequency ranges in the vicinity thereof, a maximum value among the value of the corresponding frequency spectrum and the values of the frequency spectra in the frequency ranges in the vicinity thereof, and a minimum value among the value of the corresponding frequency spectrum and the values of the frequency spectra in the frequency ranges in the vicinity thereof.

8. A signal processing apparatus, comprising:
a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;
a calculating unit determining a third sound signal which has a reduced influence of the operation sound by using the second sound signal and a sound signal representing the operation sound;
a correcting unit performing a correction, by setting a sound signal representing the target sound among the second sound signal as a reference signal, on a frequency characteristic of the third sound signal based on a frequency characteristic of the reference signal; and
a signal inverse transforming unit inverse-transforming a sound signal on which the correction is performed by the correcting unit from the sound signal represented by the frequency function into the sound signal represented by the time function,
wherein:
the frequency characteristic is a frequency spectrum;
the correcting unit performs a correction on the third sound signal based on a result obtained by comparing a value of a frequency spectrum in each frequency range of the third sound signal with a value of a frequency spectrum in a corresponding frequency range of the reference signal multiplied by a coefficient; and the correcting unit performs a correction on the value of the frequency spectrum of the third sound signal to prevent the value from being lower than a correction value being calculated by using the value of a corresponding frequency spectrum of the reference signal multiplied by the coefficient and values of frequency spectra in frequency ranges in a vicinity thereof among frequency spectra of the reference signal multiplied by the coefficient when the value of the frequency spectrum of the third sound signal is less than the value of the corresponding frequency spectrum.

9. The signal processing apparatus according to claim 8, wherein the correction value is any one of an average of the value of the corresponding frequency spectrum and the values of the frequency spectra in the frequency ranges in the vicinity thereof, a maximum value among the value of the corresponding frequency spectrum and the values of the frequency spectra in the frequency ranges in the vicinity thereof, and a minimum value among the value of the corresponding frequency spectrum and the values of the frequency spectra in the frequency ranges in the vicinity thereof.

10. An imaging apparatus, comprising:

an imaging unit obtaining an image signal;

a sound pickup unit obtaining a sound signal in synchronization with an obtainment of the image signal by the imaging unit;

the signal processing apparatus according to claim 1; and a storage unit storing the image signal obtained by the imaging unit and a sound signal on which signal processing is performed by the signal processing apparatus.

11. A signal processing apparatus, comprising:

a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;

a signal calculating unit determining a third sound signal which has a reduced influence of the operation sound by using the second sound signal and a sound signal representing the operation sound;

a proportion calculating unit determining, by setting a sound signal representing the target sound among the second sound signal as a reference signal, a proportion between an intensity of the reference signal and an intensity of the third sound signal;

a correcting unit correcting a frequency characteristic of the third sound signal based on a frequency characteristic of the reference signal multiplied by the proportion; and a signal inverse transforming unit inverse-transforming a sound signal corrected by the correcting unit from the sound signal represented by the frequency function into the sound signal represented by the time function.

12. The signal processing apparatus according to claim 11, wherein:

the frequency characteristic is a frequency spectrum; and the correcting unit performs a correction on the frequency characteristic of the third sound signal in each of the third sound signal and the reference signal multiplied by the proportion based on a ratio between a value based on a value of a frequency spectrum in at least one of frequency ranges and a value of a frequency spectrum in remaining frequency ranges.

13. The signal processing apparatus according to claim 12, wherein the ratio is a ratio between a value of a frequency spectrum in a certain frequency range and either a total sum of a value of a frequency spectrum in all of the frequency ranges or an average value of the frequency spectrum in all of the frequency ranges.

14. The signal processing apparatus according to claim 12, wherein the ratio is a ratio between the value of the frequency spectrum in the specific frequency range and either a total sum of a value of a frequency spectrum in a specific frequency range among the frequency ranges and values of frequency spectra in frequency ranges in a vicinity of the specific frequency range or an average value of the value of the frequency spectrum in the specific frequency range and the values of the frequency spectra in the frequency ranges in the vicinity of the specific frequency range.

15. An imaging apparatus, comprising:

an imaging unit obtaining an image signal;

a sound pickup unit obtaining a sound signal in synchronization with an obtainment of the image signal by the imaging unit;

the signal processing apparatus according to claim 11; and a storage unit storing the image signal obtained by the imaging unit and a sound signal on which signal processing is performed by the signal processing apparatus.

16. A signal processing apparatus, comprising:

a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;

a calculating unit determining a third sound signal which has a reduced influence of the operation sound by using the second sound signal and a sound signal representing the operation sound;

a correcting unit performing a correction, by setting a sound signal representing the target sound among the second sound signal as a reference signal, on a frequency spectrum of the third sound signal based on a frequency spectrum of the reference signal; and a signal inverse transforming unit inverse-transforming a sound signal on which the correction is performed by the correcting unit from the sound signal represented by the frequency function into the sound signal represented by the time function, wherein:

the correcting unit performs a correction on the third sound signal based on a result obtained by comparing a value of a frequency spectrum in each frequency range of the third sound signal with a value of a frequency spectrum in a corresponding frequency range of the reference signal multiplied by a coefficient; and the correcting unit corrects the value of the frequency spectrum of the third sound signal when the value of the frequency spectrum of the third sound signal is different from the value of the corresponding frequency spectrum of the reference signal multiplied by the coefficient.

17. The signal processing apparatus according to claim 16, wherein the correcting unit does not correct the value of the frequency spectrum of the third sound signal when the value of the frequency spectrum of the third sound signal is not different from the value of the corresponding frequency spectrum of the reference signal multiplied by the coefficient.

18. An imaging apparatus, comprising:

an imaging unit obtaining an image signal:

a sound pickup unit obtaining a sound signal in synchronization with an obtainment of the image signal by the imaging unit;

the signal processing apparatus according to claim 16; and a storage unit storing the image signal obtained by the imaging unit and a sound signal on which signal processing is performed by the signal processing apparatus.

19. A signal processing apparatus, comprising:

a signal transforming unit transforming a first sound signal for each predetermined time width obtained by dividing a sound signal by the predetermined time width into a second sound signal represented by a frequency function, the sound signal being represented by a time function and in which a target sound and an operation sound are mixed;

a signal calculating unit determining a third sound signal which has a reduced influence of the operation sound by using the second sound signal and a sound signal representing the operation sound;

a proportion calculating unit determining, by setting a sound signal representing the target sound among the second sound signal as a reference signal, a proportion between an intensity of the reference signal and an intensity of the third sound signal;

a correcting unit correcting a frequency characteristic of the third sound signal by employing the proportion and a frequency characteristic of the reference signal; and a signal inverse transforming unit inverse-transforming a sound signal corrected by the correcting unit from the sound signal represented by the frequency function into the sound signal represented by the time function.

20. An imaging apparatus, comprising:

an imaging unit obtaining an image signal;

a sound pickup unit obtaining a sound signal in synchronization with an obtainment of the image signal by the imaging unit;

the signal processing apparatus according to claim 19; and a storage unit storing the image signal obtained by the imaging unit and a sound signal on which signal processing is performed by the signal processing apparatus.

* * * * *